(12) United States Patent
Sugawara et al.

(10) Patent No.: US 8,896,911 B2
(45) Date of Patent: Nov. 25, 2014

(54) LASER SYSTEM

(75) Inventors: Mitsuru Sugawara, Kanagawa (JP);
Makoto Usami, Kanagawa (JP);
Tomoyuki Akiyama, Kanagawa (JP)

(73) Assignee: QD Laser, Inc., Kawasaki-shi (JP)

( * ) Notice: Subject to any disclaimer, the term of this patent is extended or adjusted under 35 U.S.C. 154(b) by 335 days.

(21) Appl. No.: 13/062,357

(22) PCT Filed: Jul. 30, 2009

(86) PCT No.: PCT/JP2009/063595
§ 371 (c)(1),
(2), (4) Date: Mar. 4, 2011

(87) PCT Pub. No.: WO2010/032561
PCT Pub. Date: Mar. 25, 2010

(65) Prior Publication Data
US 2011/0157685 A1    Jun. 30, 2011

(30) Foreign Application Priority Data
Sep. 19, 2008  (JP) .................................. 2008-241510

(51) Int. Cl.
*G02F 1/35* (2006.01)
*H01S 3/10* (2006.01)
*H01S 5/12* (2006.01)
*H01S 5/50* (2006.01)

(52) U.S. Cl.
CPC .... *H01S 5/12* (2013.01); *H01S 5/50* (2013.01)
USPC ................................ 359/328; 372/22; 372/26

(58) Field of Classification Search
None
See application file for complete search history.

(56) References Cited

U.S. PATENT DOCUMENTS

| | | | |
|---|---|---|---|
| 5,936,985 A | 8/1999 | Yamamoto | |
| 6,873,632 B2 * | 3/2005 | Hsieh | 372/38.02 |
| 7,983,315 B2 * | 7/2011 | Wiedmann et al. | 372/21 |
| 2002/0085605 A1 | 7/2002 | Hatori | |
| 2003/0137023 A1 * | 7/2003 | Stegmuller | 257/432 |
| 2004/0095970 A1 * | 5/2004 | Yamamoto et al. | 372/21 |
| 2006/0159139 A1 * | 7/2006 | Hu et al. | 372/26 |
| 2007/0002909 A1 * | 1/2007 | Furukawa et al. | 372/22 |
| 2009/0016388 A1 * | 1/2009 | Gu et al. | 372/25 |
| 2011/0134947 A1 * | 6/2011 | Rahum et al. | 372/29.015 |
| 2012/0163403 A1 * | 6/2012 | Essaian et al. | 372/10 |
| 2013/0010821 A1 * | 1/2013 | Yokoyama | 372/28 |
| 2013/0107900 A1 * | 5/2013 | Hayakawa | 372/36 |

FOREIGN PATENT DOCUMENTS

| | | |
|---|---|---|
| JP | 6-132595 | 5/1994 |
| JP | 2002-84034 A1 | 3/2002 |
| JP | 2002-158399 A1 | 5/2002 |
| JP | 2002-204033 A1 | 7/2002 |
| JP | 2006-261590 A1 | 9/2006 |
| JP | 2007-194416 A1 | 8/2007 |

OTHER PUBLICATIONS

International Search Report for International Application No. PCT/JP2009/063595 dated Aug. 12, 2009.

\* cited by examiner

Primary Examiner — Hemang Sanghavi
(74) Attorney, Agent, or Firm — Kratz, Quintos & Hanson, LLP

(57) ABSTRACT

The present invention is a laser system including a DFB laser 10 emitting a laser light 50, a semiconductor optical amplifier 20 that modulates an intensity of the laser light, and a harmonic generation element 30 that converts the laser light modulated to a visible light 54 that is a harmonic of the laser light. According to the present invention, it is possible to employ the highly efficient harmonic generation element capable of modulating the intensity of the laser light and to reduce power consumption.

10 Claims, 11 Drawing Sheets

US 8,896,911 B2

LASER SYSTEM

TECHNICAL FIELD

The present invention relates to laser systems, and more particularly, to a laser system that emits a visible light.

BACKGROUND ART

Recently, laser systems that emit laser beams have been used in various fields. Particularly, a less-expensive laser system is equipped with a semiconductor laser. However, a semiconductor laser that emits green light has not yet been realized.

Patent Document 1 describes a laser system that emits green light by converting laser light emitted by a semiconductor laser to a secondary harmonic by a non-linear optical element.

Patent Document
Patent Document 1: Japanese Laid-Open Patent Publication No. 6-132595

SUMMARY OF THE INVENTION

Problem to be Solved by the Invention

For example, a laser projection using a laser beam for projection is being studied. Since a semiconductor laser that emits green light (having a wavelength of 520-550 nm, more preferably, 530-540 nm) has not been realized, it is conceivable to use, for example, the laser system described in Patent Document 1. In the laser projection, the laser light is modulated at a speed as high as about 100 MHz. Since the response of the non-linear optical element in the laser system described in Patent Document 1 is high, the high-speed modulation of about 100 MHz can be realized.

However, an attempt to improve the efficiency of conversion to the harmonic by the non-linear optical element narrows the tolerable wavelength range. In a case where the wavelength of the laser light emitted by the semiconductor laser is fixed, there is a difficulty in modulating the intensity of the laser light. As described above, the laser system that emits the visible light such as green light has a problem of difficulty in improvement of the efficiency.

The present invention was made in view of the above problem, and has an object of providing a laser system capable of modulating the intensity of the laser light and improving the efficiency.

Means for Solving the Problem

The present invention is a laser system characterized by comprising: a DFB laser emitting a laser light; a semiconductor optical amplifier that modulates an intensity of the laser light; and a harmonic generation element that converts the laser light modulated to a visible light that is a harmonic of the laser light. According to the present invention, it is possible to employ the highly efficient harmonic generation element capable of modulating the intensity of the laser light and to reduce power consumption.

In the above structure, the laser system may be configured so that: the DFB laser emits the laser light having a wavelength within an operating range of the harmonic generation element; and the semiconductor optical amplifier modulates the intensity of the laser light without changing the wavelength of the laser light.

In the above structure, the laser system may be configured so that the DFB laser is a quantum dot DFB laser.

In the above structure, the laser system may be configured so that the DFB laser and the semiconductor optical amplifier are formed on an identical chip.

The present invention is a laser system characterized in that: a DFB laser having a quantum dot active layer from which a laser light is emitted; and a harmonic generation element that converts the laser light to a visible light that is a harmonic of the laser light. According to the present invention, it is possible to employ the highly efficient harmonic generation element capable of modulating the intensity of the laser light and to reduce power consumption.

In the above structure, the laser system may be configured so that the DFB laser emits the laser light having a modulated intensity.

In the above structure, the laser system may be configured so that the visible light is green light.

In the above structure, the laser system may be configured so that the harmonic generation element converts the laser light modulated to a second harmonic of the laser light.

In the above structure, the laser system may be configured so as to further comprise a temperature control pat that controls a temperature of the DFB laser to be constant.

Effects of the Invention

According to the present invention, it is possible to employ the highly efficient harmonic generation element capable of modulating the intensity of the laser light and to reduce power consumption.

EMBODIMENTS FOR CARRYING OUT THE INVENTION

A detailed description is now given of a problem of a laser system that emits a harmonic of a semiconductor laser. FIG.

Figure 1:
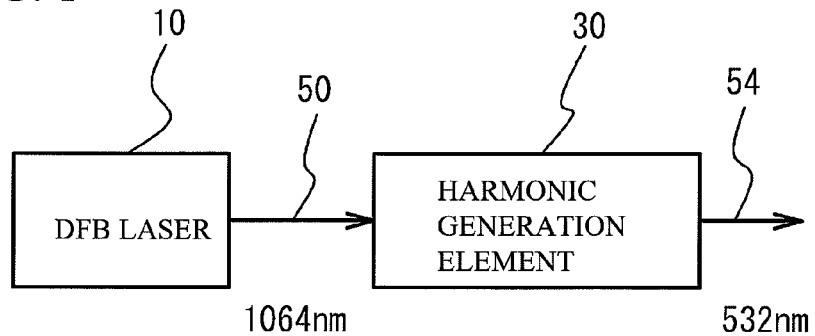
FIG. 1 is a block diagram of a laser system in accordance with a comparative example.

1 is a block diagram of a laser system in accordance with a comparative example. As illustrated in FIG. 1, the laser system of the comparative example has a DFB (Distributed Feedback Bragg) laser 10 and a harmonic generation element 30. The DFB laser 10 is a laser that has a corrugation and emits a laser light of a single wavelength, and emits a laser light having a wavelength of 1064 nm. The harmonic generation element 30 is a non-linear optical element and converts a laser light 50 to a green light 54, which a harmonic of the laser light 50. The harmonic generation element 30 may be, for example, PPLN (Periodically Poled Lithium Niobate) and emits the green light (visible light) 54 of 532 nm, which is the second harmonic of the laser light 50. The laser system that emits the green light 54 is realized as described above.

Figure 2:
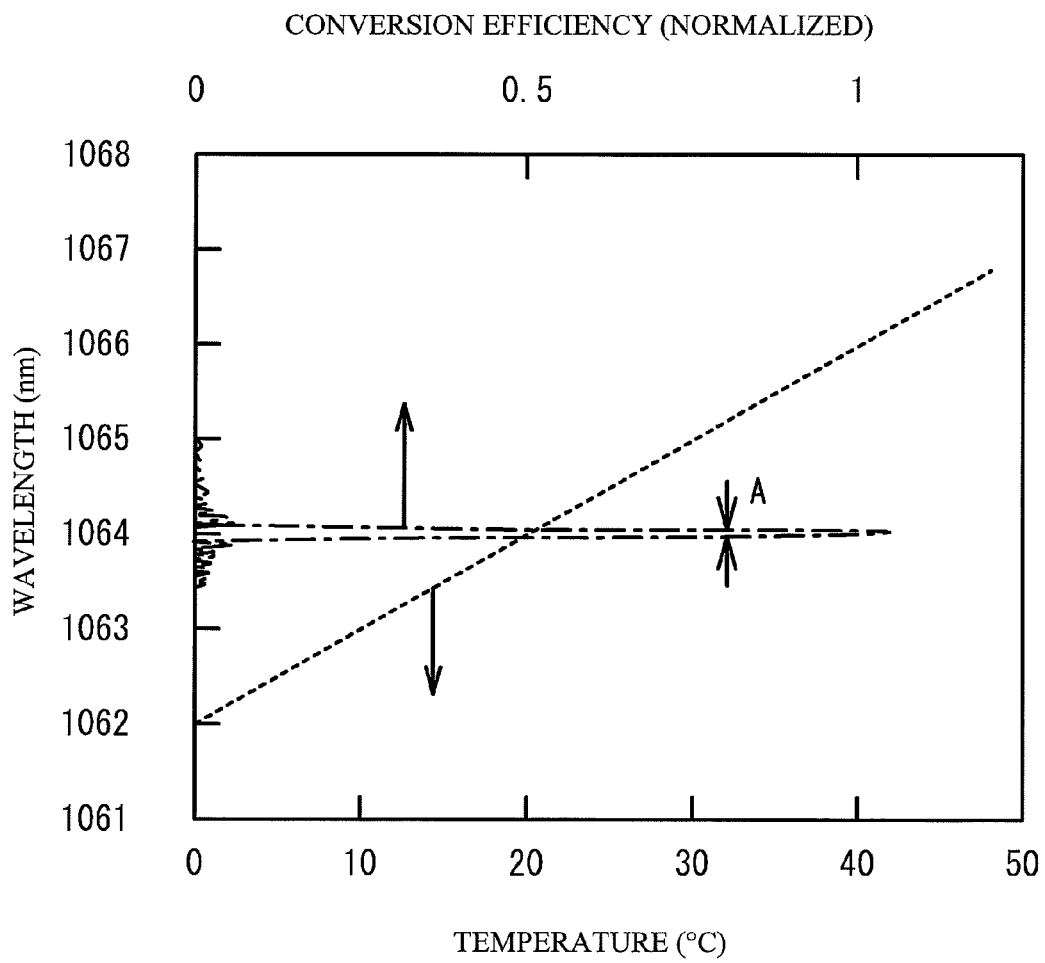
FIG. 2 is a schematic figure that indicates a wavelength of a laser light of a DFB laser and an element temperature, and indicates the wavelength of the laser light and a conversions efficiency of a harmonic generation element.

A one-dot changed line illustrated in FIG. 2 schematically indicates a relationship between the conversion efficiency of PPLN and wavelength, and a broken line schematically indicates a relationship between the temperature and the wavelength in a case where a device current of the DFB laser 10 with a quantum well (QW) active layer composed of InGaAs is kept constant. The harmonic generation element 30 that generates a harmonic such as PPLN has a characteristic such that an attempt to improve the efficiency of conversion from the primary wave to the harmonic by the non-linear optical element narrows the tolerable wavelength range. In the example of FIG. 2, the tolerable wavelength range is very narrow in a range A in the vicinity of about 1064 nm, In contrast, as indicated by the broken line in FIG. 2, the wavelength of the DFB laser 10 greatly depends on the temperature. Therefore, the temperature of the DFB laser 10 is controlled to be located in the narrow range. In the example of FIG. 2, the temperature of the DFB laser 10 is controlled to 20° C.

Figure 3:
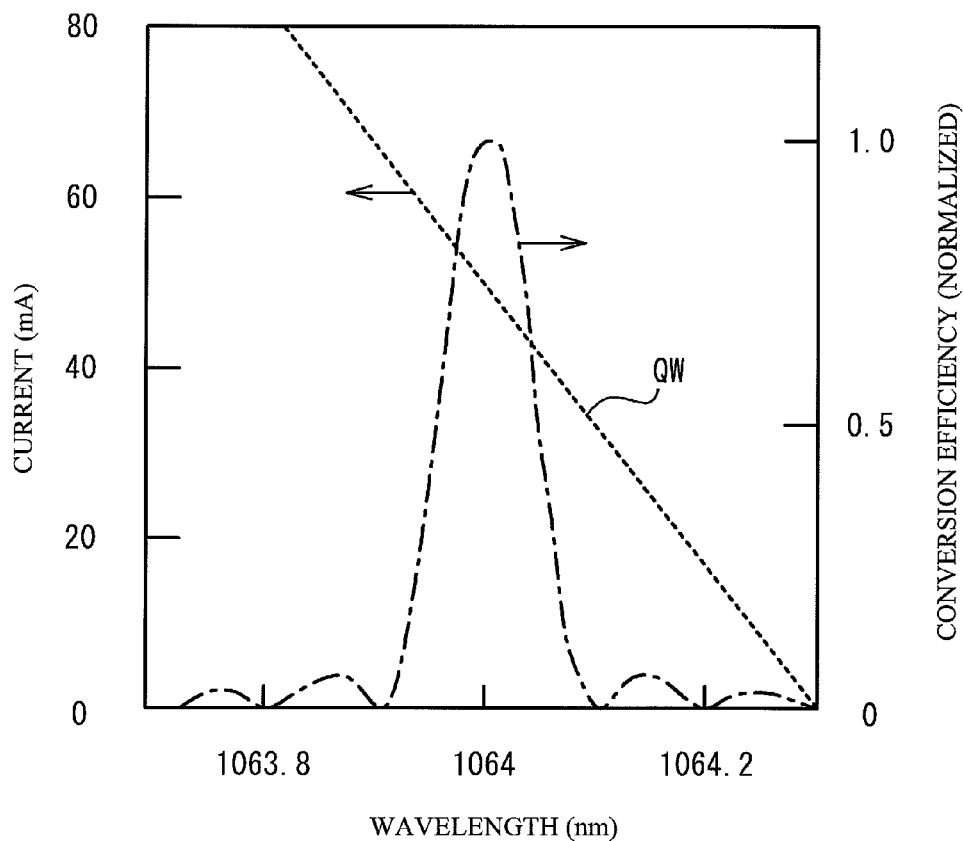
FIG. 3 is a schematic figure that indicates a device current of a DFB laser and the wavelength of the laser light.

For example, the light source used for the laser projection is required to modulate the intensity of light. Thus, the device current of the DFB laser 10 is modulated. A broken line indicated by QW in FIG. 3 schematically indicates a relationship between the device current and the wavelength in a case where the temperature is fixed, and a one-dot chained line schematically indicates a relationship between the conversion efficiency of PPLN and the wavelength. As illustrated in FIG. 3, the wavelength changes by varying the device current and goes beyond the tolerable wavelength range of PPLN (for example, a range of an effective efficiency of 80%). As described above, in the laser system of the comparative example, an attempt to modulate the intensity of the outgoing light widens the wavelength range and prevents the use of the highly efficient harmonic generation element 30. Thus, the consumed power increases.

Figure 4:
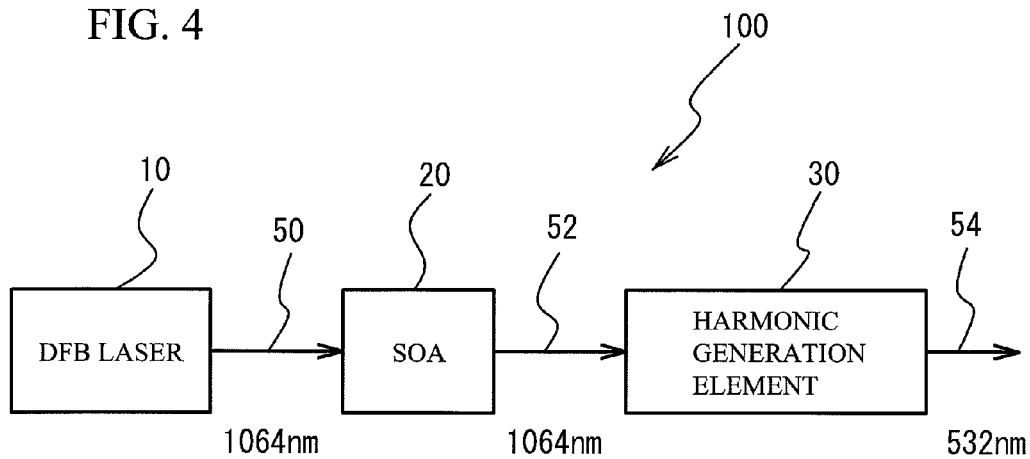
FIG. 4 is a block diagram of a first embodiment.

FIG. 4 is a diagram that illustrates a first embodiment that solves the above problem. As illustrated in FIG. 4, a laser system 100 has the DFB laser 10, a semiconductor optical amplifier (SOA) 20, and the harmonic generation element 30. The DFB laser 10 emits a laser light 50 having a single wavelength (1064 nm). The SOA 20 modulates the intensity of the laser light 50, and emits a modulated laser light 52 having a wavelength of 1064 nm. The harmonic generation element 30 converts the modulated laser light 52 to the green light (visible light) 54.

In the laser system 100 in FIG. 4, the DFB laser 10 emits the laser light 50 having a wavelength within an operating range (for example, the range A in FIG. 2) of the harmonic generation element. The SOA 20 modulates the intensity of the laser light 50 without changing the wavelength of the laser light 50 and emits the resultant laser light 52. Thus, the intensity of the laser light 52 has been modulated, and the wavelength of the laser light 52 is within the tolerable range of the harmonic generation element 30 and does not change. It is thus possible to use the highly efficient harmonic generation element 30 and reduce the power consumption. In the DFB laser, an increase in the intensity of the output laser light degrades the single mode characteristic. The laser system 100 is capable of suppressing the intensity of the laser light 50 of the DFB laser 20 and improving the single mode characteristic of the laser light 50. Further, by increasing the gain of the SOA 20, it is possible to increase the intensity of the laser light 52 while maintaining the single mode characteristic.

Figure 5:
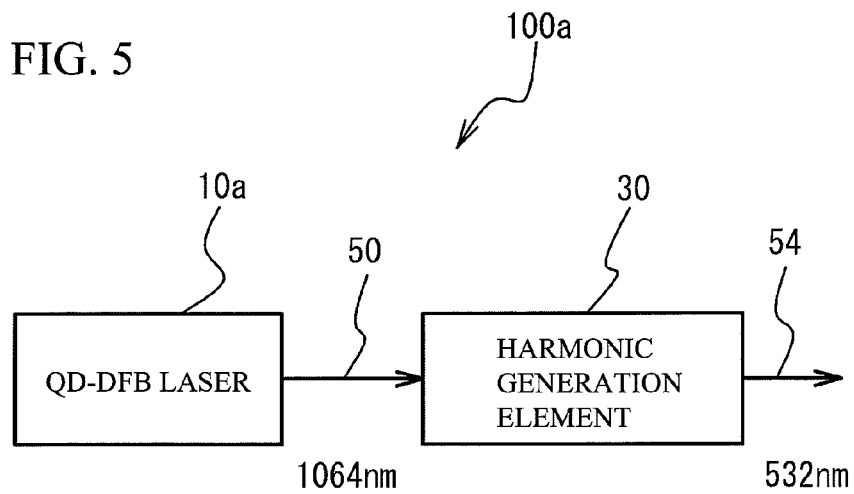
FIG. 5 is a block diagram of a second embodiment.

FIG. 5 is a block diagram of a laser system 100a in accordance with a second embodiment. The laser system 100a has a QD (Quantum Dot)-DFB laser 10a and the harmonic generation element 30. The QD-DFB laser 10a is a DFB laser having a quantum dot active layer, and emits the laser light 50 of 1064 nm. The harmonic generation element 30, which may be, for example, PPLN, converts the laser light 50 to the green light 54 that is a harmonic and has a wavelength of 532 nm, and emits the green light 54.

Figure 6:
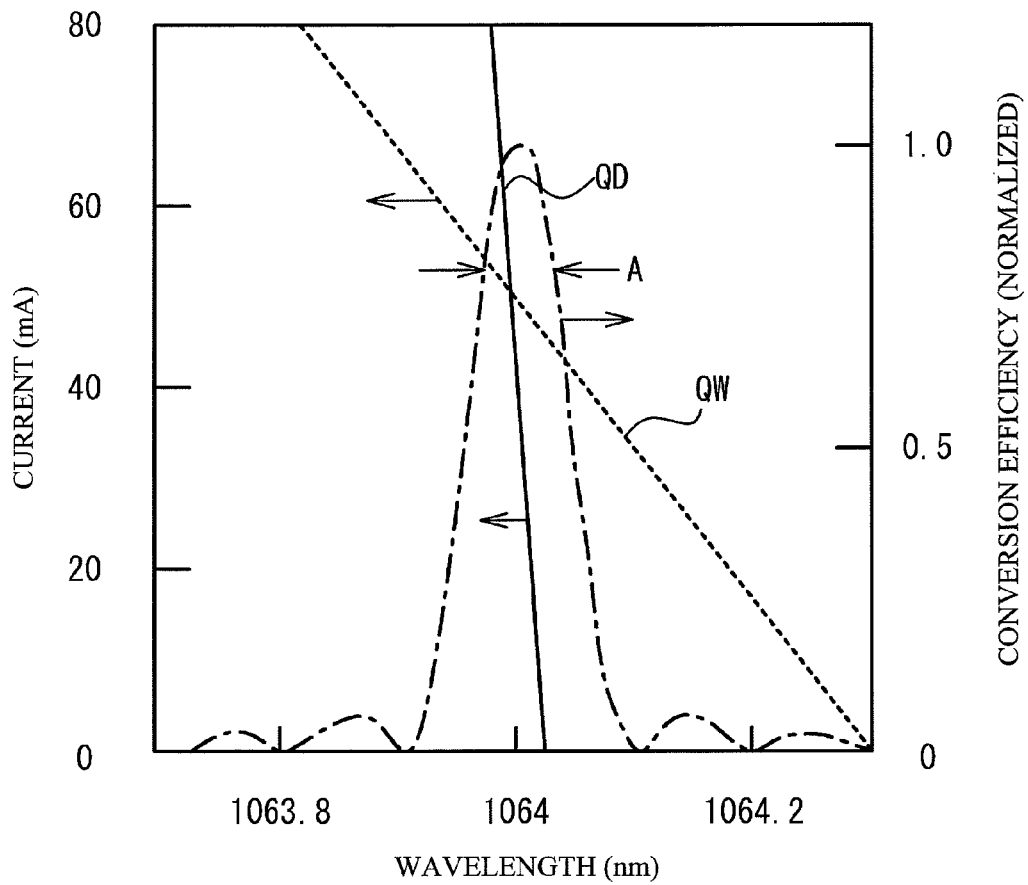
FIG. 6 is a schematic figure that indicates the device current and the wavelength of the laser light and indicates the conversion efficiency of the harmonic generation element and the wavelength of the laser light of the DFB laser.
Figure 7:
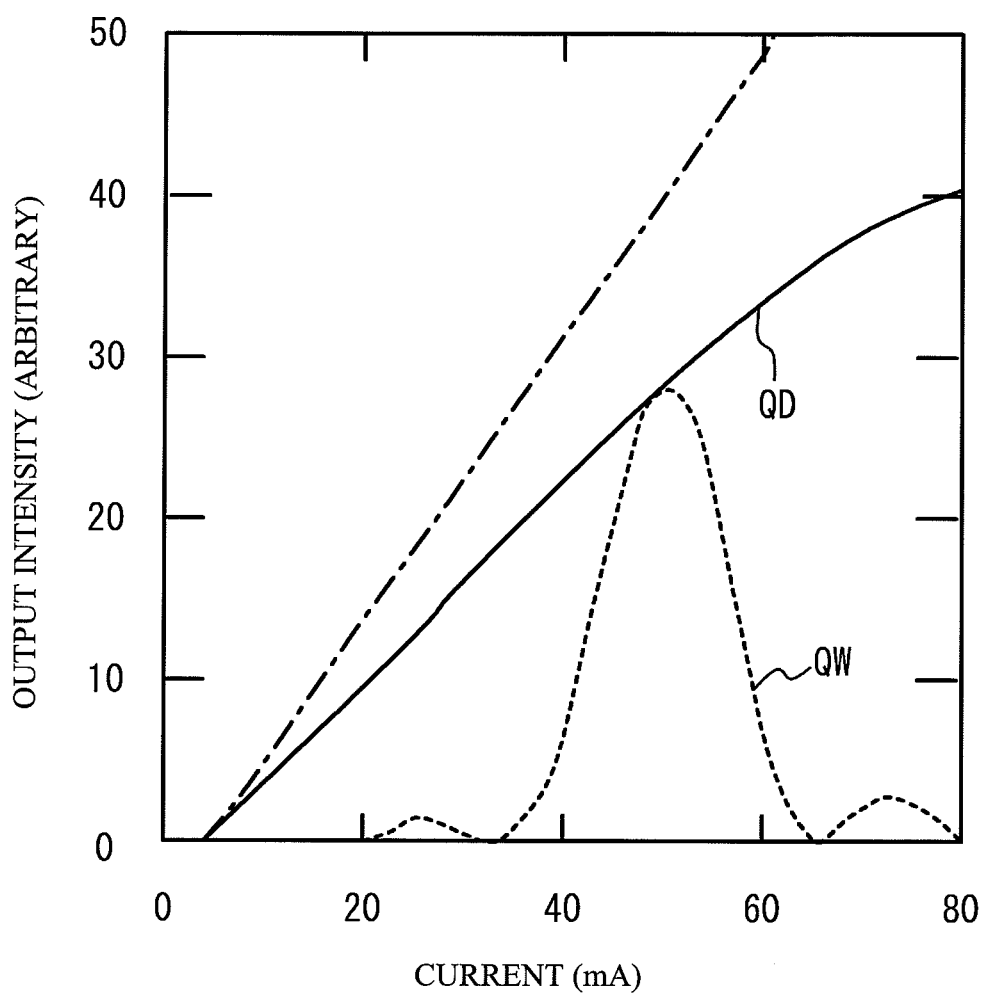
FIG. 7 is a schematic figure that indicates an output light intensity of the harmonic generation element and the device current of the DFB laser.

FIG. 6 is a figure formed by adding, to the graph of FIG. 3, a solid line QD that indicates a relationship between the device current and the wavelength in a case where the temperature of the QD-DFB laser having a quantum dot of InGaAs in a GaAs base layer is fixed. In FIG. 6, QD indicates the case of the QD-DFB laser, and QW is the case of the QW (Quantum Well)-DFB laser. As illustrated in FIG. 6, the QD-DFB laser has only a little change in the wavelength even by changing the device current. FIG. 7 is a figure that schematically illustrates a relationship between the output light intensity of PPLN and the device current. A one-dot chained line schematically illustrates a relationship between the intensity of the laser light 50 incident to PPLN and the device current. As illustrated in FIG. 7, the QW-DFB laser emits light only in a case where the device current is within the range of 40-60 mA. In contrast, the QD-DFB laser is capable of modulating the output light intensity of the green light 54 by changing the device current to 0-80 mA. As described above, the highly efficient harmonic generation element 30 may be used and power consumption may be reduced.

According to the first and second embodiments, it is possible to provide the less-expensive, highly efficient laser system capable of emitting the visible light, which can not be easily emitted by the semiconductor laser and implementing high-speed modulation. Particularly, it is possible to obtain green light used for applications such as laser projection.

The harmonic generation element 30 may generate a higher-order harmonic rather than the secondary harmonic. However, from a viewpoint of the conversion efficiency, it is preferable that the harmonic generation element 30 converts the modulated laser light (the laser light 52 in FIG. 4, the laser light 50 in FIG. 5) to the secondary harmonic thereof.

Examples of the first and second embodiments are described below.

EXAMPLE 1

Figure 8:
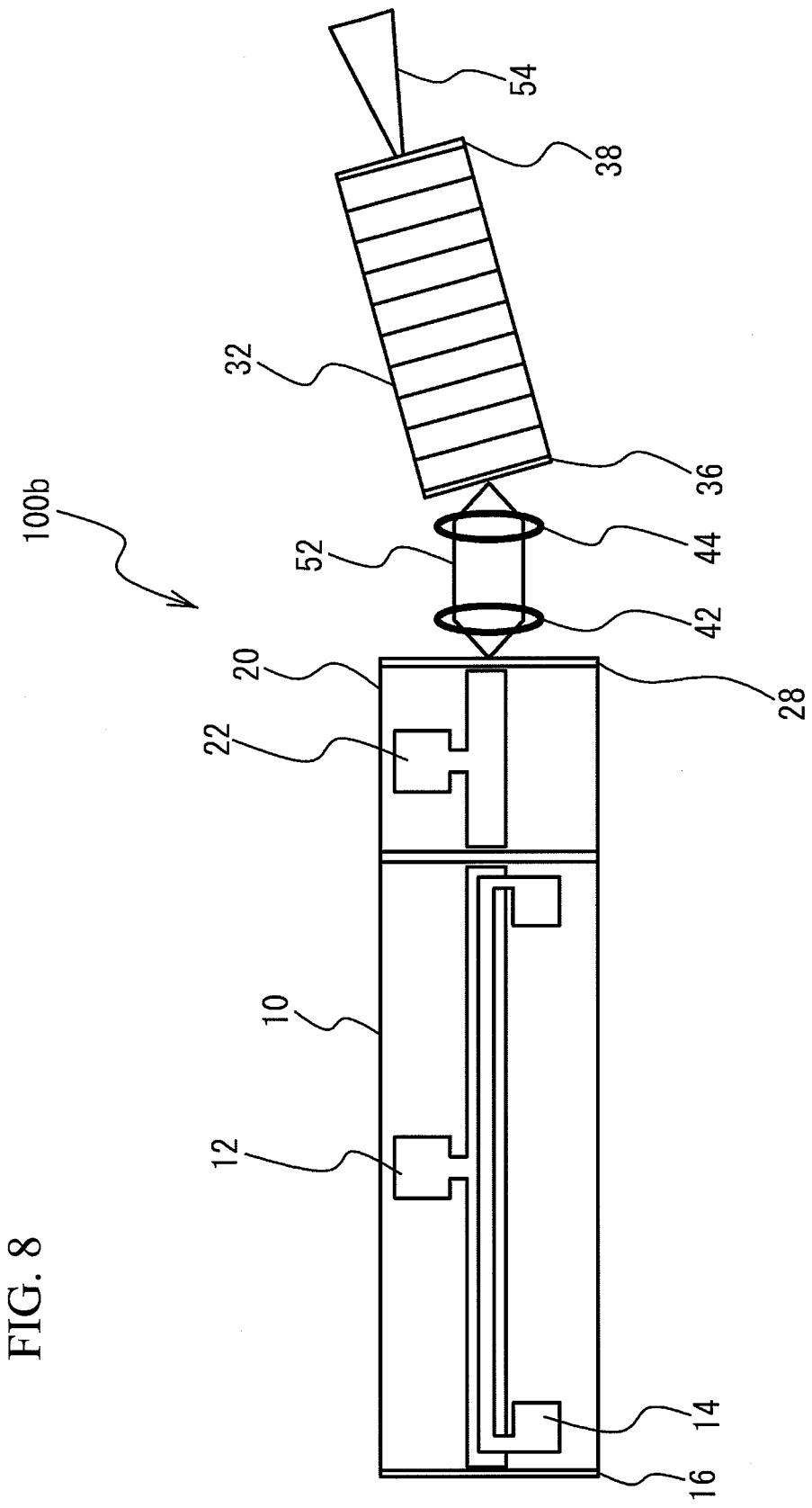
FIG. 8 is a plan view of a laser system in accordance with an example 1.

A first example is an example of the first embodiment. FIG. 8 is a plan view of a laser system 100b in accordance with the first example. The laser system 100b has the DFB laser 10, the SOA 20, collimating lenses 42 and 44, and PPLN 32. On the upper surface of the DFB laser 10, there are provided an electrode 12 for applying a device current, and a heater 14 through which a current for controlling the temperature of the DFB laser 10 flows. An HR (High Reflection) film 16 with respect to light of 1064 nm of the oscillation wavelength of laser is formed on one end of the DFB laser 10 through which the laser light is not emitted. An electrode 22 for applying current for modulating the laser light is formed on the upper surface of the SOA 20. An AR (Anti-Reflection) film 28 with respect to 1064 nm is formed on one end of the SOA 20 through which the laser light 52 is emitted. The DFB laser 10 and the SOA 20 are formed on an identical chip, and the optical axis of the DFB laser 10 and that of the SOA 20 are aligned.

The modulated laser light 52 emitted from the SOA 20 is incident to one end surface of the PPLN 32 through the collimating lenses 42 and 44. The surfaces of the collimating lenses 42 and 44 are coated with an AR film (not illustrated) with respect to a wavelength of 1064 nm. The end surface of the PPLN 32 to which the laser light 52 is incident is coated with an AR film 36 with respect to a wavelength of 1064 nm. An end surface of the PPLN 32 from which the green light 54 is emitted is coated with an AR film 38 with respect to a wavelength of 532 nm, which is a wavelength of RF.

Figure 9:
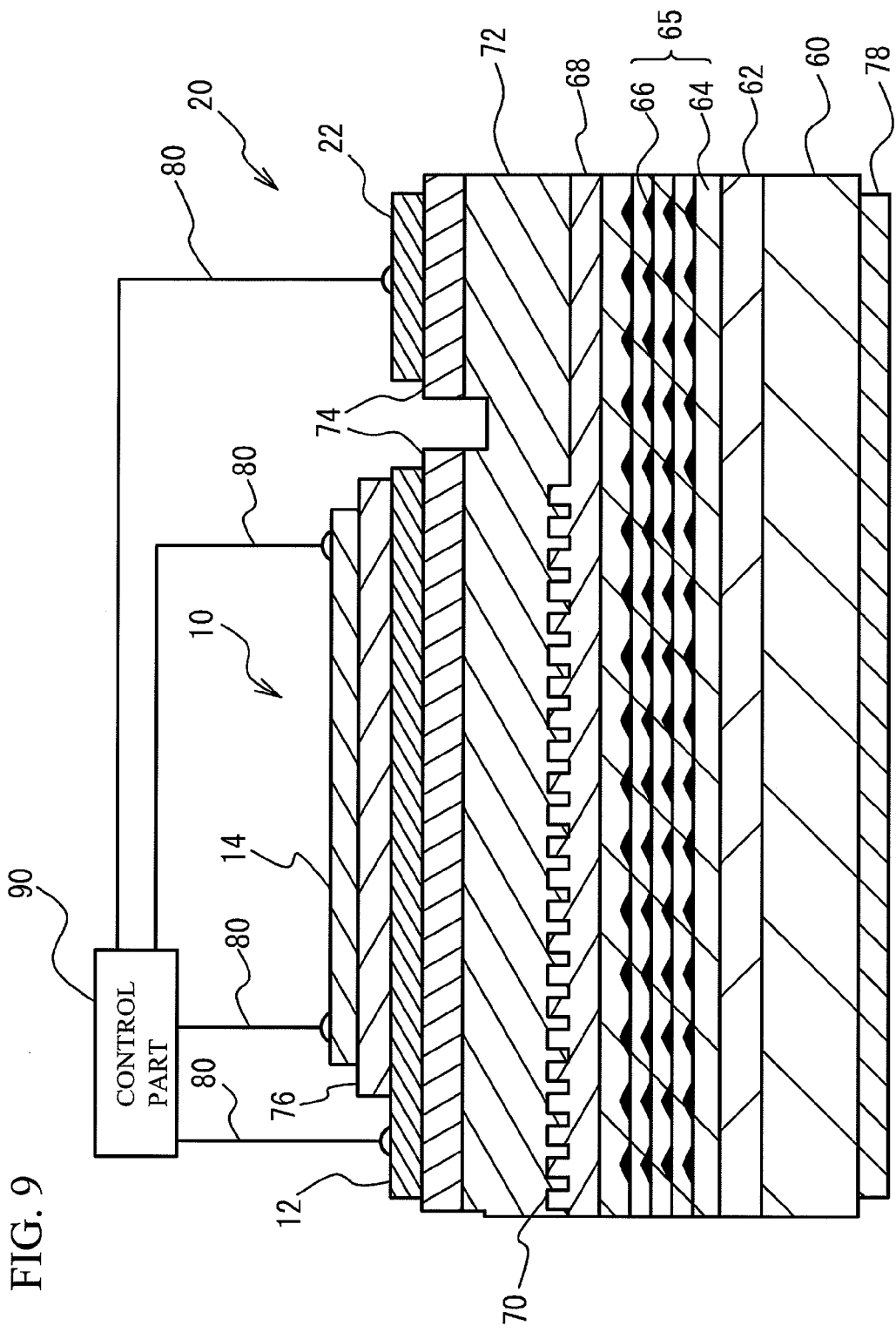
FIG. 9 is a cross-sectional view of a DFB laser and an SOA.

FIG. 9 is a cross-sectional view of the DFB laser 10 and the SOA 20. Referring to FIG. 9, an n-type clad layer 62 of n-type $Al_{0.35}Ga_{0.65}As$ is formed on an n-type GaAs substrate 60. An electrode 78 is formed on the backside of the substrate 60. A quantum dot active layer 65 having quantum dots of InAs in a base laser 64 of GaAs is formed on the n-type clad layer 62. A p-type layer 68 of p-type GaAs is formed on the quantum dot active layer 65. A p-type clad layer 72 of p-type InGaP is formed on the p-type layer 68. A corrugation 70 which determines the wavelength of the laser light is formed between the p-type layer 68 of the DFB laser 10 and the p-type clad layer 72 thereof. The DFB laser 10 and the SOA 20 share layers from the substrate 60 to the p-type clad layer 72.

Contact layers 74 of $p^+GaAs$ are formed on p-type clad layer 72 of the DFB laser 10 and the SOA 20. In the DFB laser 10, an electrode 12 is formed on the contact layer 74. An insulation film 76 made of silicon oxide is formed on the electrode 12. The heater 14 made of Pt is formed on the insulation film 76. The heater 14 functions as a temperature control part that controls the temperature of the DFB laser 10 so as to be kept constant. In the SOA 20, an electrode 22 is formed on the contact layer 74. A control part 90 applies a voltage to the electrodes 12 and 22 and the heater 14 via wires 80. The electrode 78 is connected to a constant potential. For example, the electrode 78 is grounded.

The control part 90 applies a voltage to the electrode 12 of the DFB laser 10 so that a current flows between the electrode 12 and the electrode 78. Thus, induced emission is caused in the quantum dot active layer 65, and a laser light of 1064 nm is propagated in proximity to the active layer 65. The control part 90 causes a current to flow through the heater 14, so that the temperature of the DFB laser can be kept constant. The control part 90 applies a voltage between the electrode 22 and the electrode 78 so that the laser light in the active layer 65 an be amplified. By changing the voltage between the electrode 22 and the electrode 78, the gain of the SOA 20 may be changed and the laser light emitted from the SOA 22 may be modulated.

Figure 10:
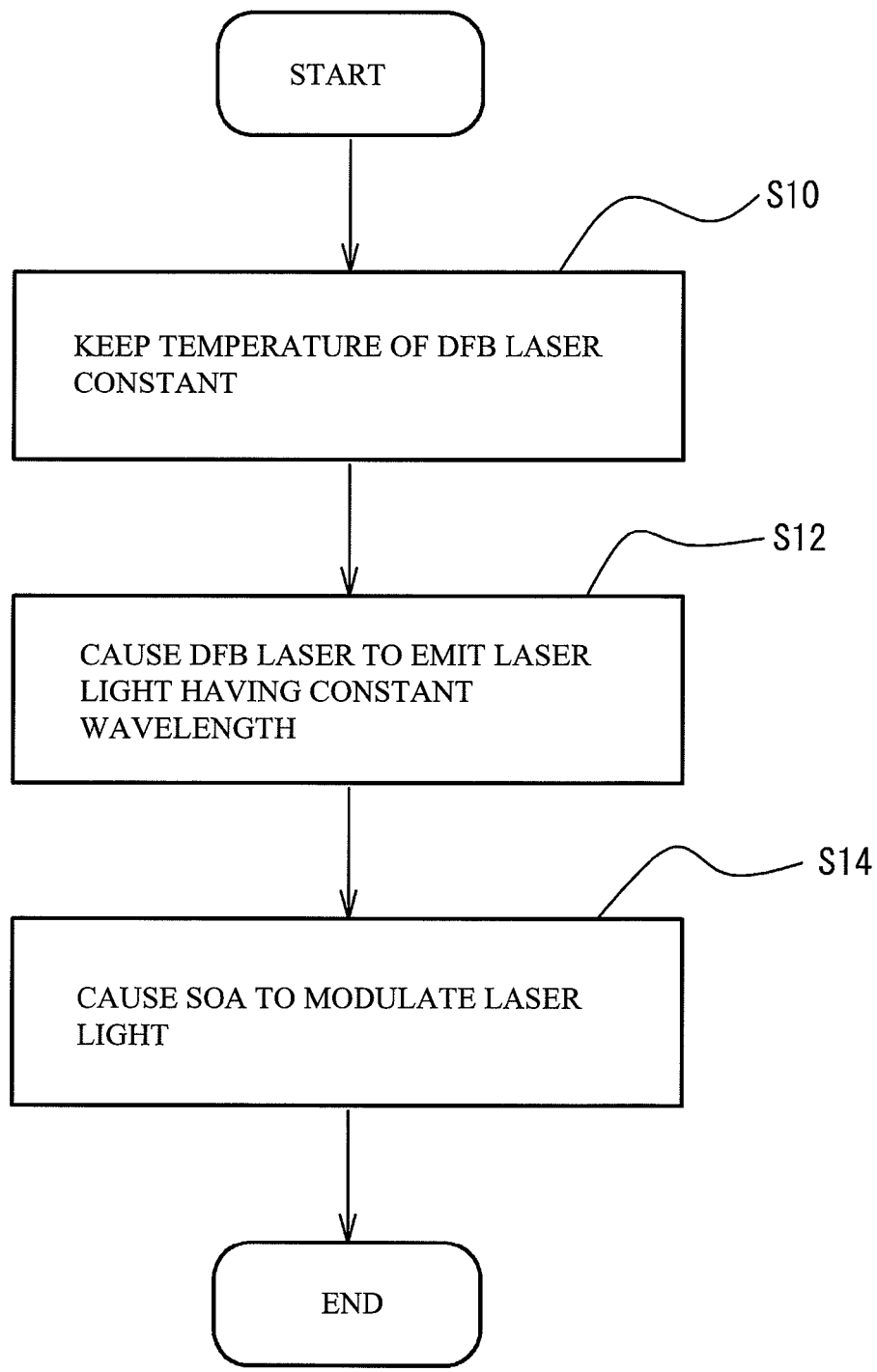
FIG. 10 is a flowchart that indicates a control of a control part.

FIG. 10 is a flowchart of a control of the control part 90. First, the control part 90 controls the current that flows through the heater 14 and keeps the temperature of the DFB laser 10 constant (step S10). In this state, the control part 90 applies a DC current or pulse current between the electrode 12 and the electrode 78 of the DFB laser 10. Thus, the DFB laser 10 emits the laser light having a wavelength within the tolerable operating range of the PPLN 32 (step S12). The control part 90 applies a modulation voltage to the electrode 22 of the SOA 20 and modulates the laser light (step S14).

According to the first example, the DFB laser 10 emits the laser light having the wavelength that improves the efficiency of the PPLN 32. The SOA 20 modulates the intensity of the laser light without changing the wavelength of the laser light. The PPLN 32 emits the secondary harmonic. Thus, the intensity of the laser light 52 is modulated and the wavelength thereof is not changed. Thus, it is possible to use the highly efficient PPLN 32 and reduce the consumed power.

The DFB laser 10 may be a quantum well type DFB laser having no quantum dot. However, as in the case of the first example, by using the quantum dot DFB laser as the DFB laser 10, it is possible to further stabilize the wavelength of the laser light emitted by the DFB laser 10. It is thus possible to further improve the conversion efficiency of the PPLN 32.

As illustrated in FIG. 9, the DFB laser 10 and the SOA 20 are formed on the same chip and the common active layer 65. It is thus possible to suppress loss of the laser light between the DFB laser 10 and the SOA 20.

Since the SOA 20 and the PPLN 32 are optically coupled by the collimating lenses 42 and 44, the green light 54 may be emitted in a direction different from the direction of emission of the laser light 52 of the SOA 20.

EXAMPLE 2

Figure 11:
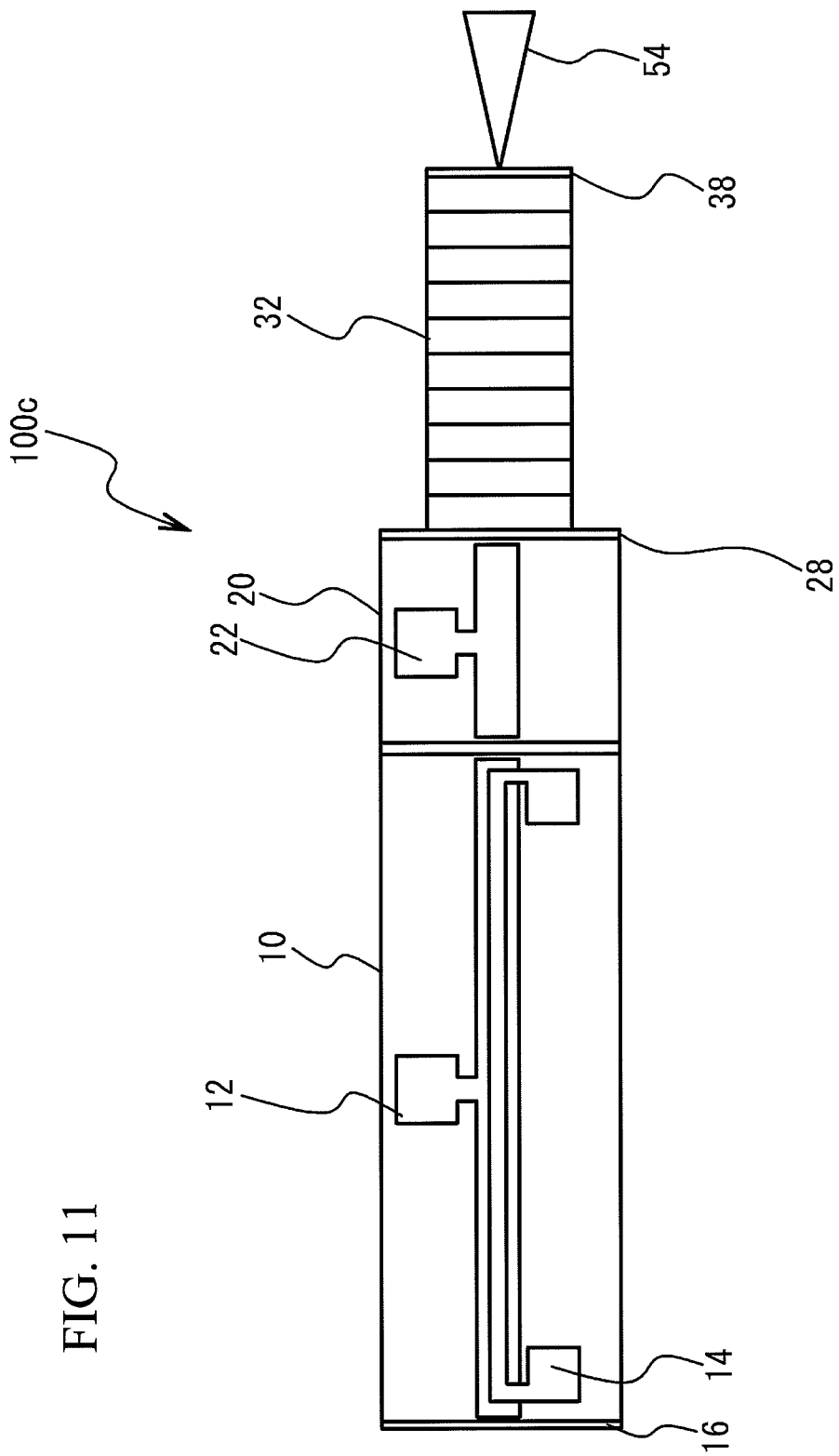
FIG. 11 is a plan view of a laser system in accordance with an example 2.

FIG. 11 is a plan view of a laser system 100c in accordance with an example 2. Referring to FIG. 11, in the laser system 100c, the SOA 20 and the PPLN 32 are directly connected. Other structures of the example 2 are the same as corresponding those of the example 1, and a description thereof is omitted. As in the case of the example 2, the collimating lenses 42 and 44 are not used but the SOA 20 and the PPLN 32 may be connected directly. It is thus possible to reduce the number of parts involved in optical coupling.

EXAMPLE 3

Figure 12:
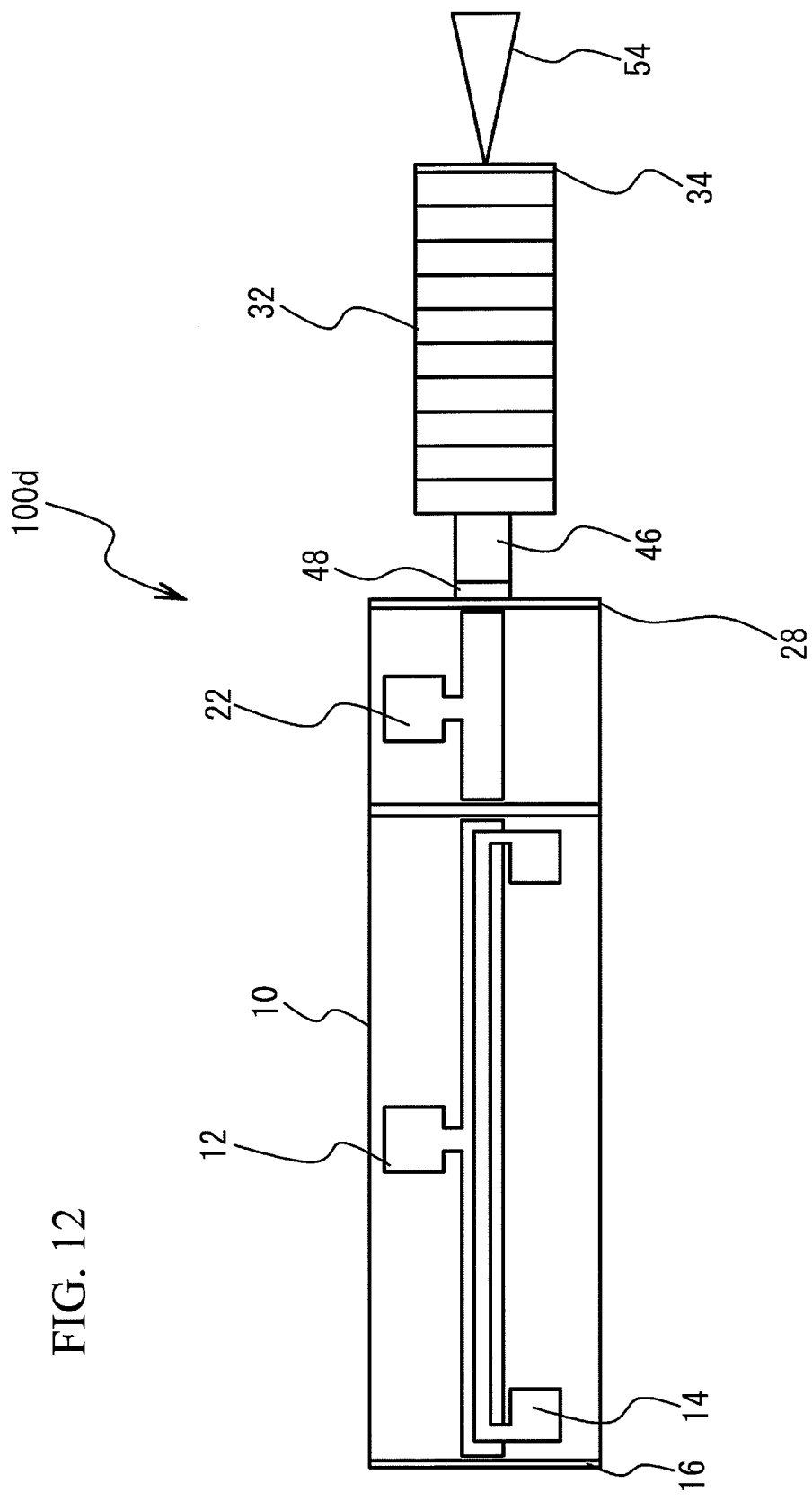
FIG. 12 is a plan view of a laser system in accordance with an example 3.

FIG. 12 is a plan view of a laser system 100d in accordance with an example 3. Referring to FIG. 12, in the laser system 100d, the SOA 20 and the PPLN 32 are optically coupled via an optical fiber 46. A portion 48 of the optical fiber 46 on an SOA 20 side has a wedge shape. Other structures of the example 3 are the same as corresponding those of the example 1, and a description thereof is omitted. According to the example 3, since the shape of the optical fiber 46 on the SOA 20 side is like a wedge, even when the laser light emitted from the SOA 20 has an elliptical shape that is vertically long, the laser light may be converted into a circular shape.

EXAMPLE 4

Figure 13:
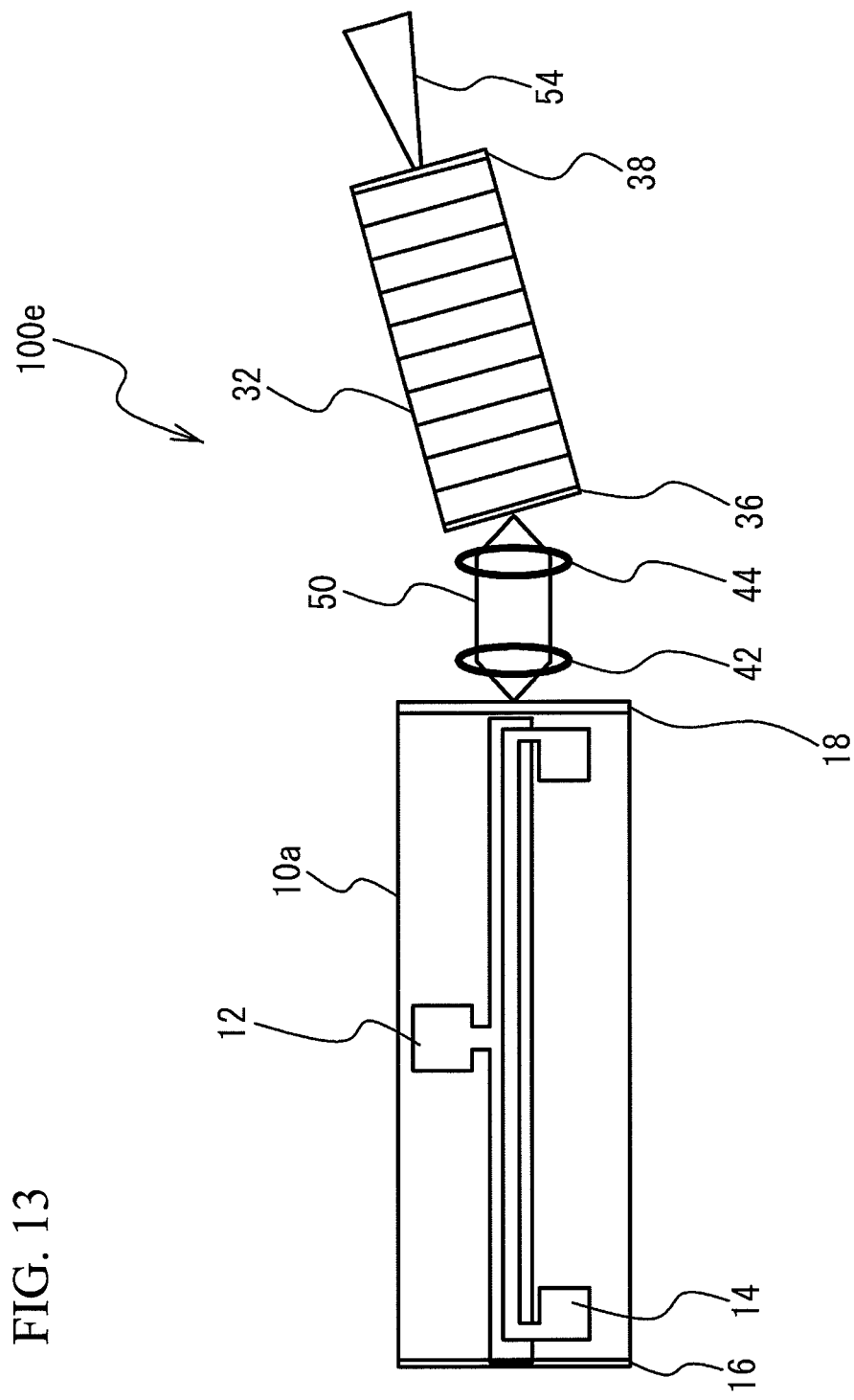
FIG. 13 is a plan view of a laser system in accordance with an example 4.

An example 4 is an example of the second embodiment. FIG. 13 is a plan view of a laser system 100e in accordance with the example 4. Referring to FIG. 13, the end surface of the quantum dot DFB laser 10a from which the laser light 50 is emitted is coated with an AR film 18. The laser light 50 is incident to the end surface of the PPLN 32 by the collimating lenses 42 and 44. Other structures of the example 4 are the same as corresponding those of the example 1 illustrated in FIG. 8, and a description thereof is omitted.

According to the example 4, since the quantum dot DFB laser 10a is employed, even when the intensity of the laser light 50 is modulated by changing the device current, the wavelength of the laser light 50 is not changed greatly. It is thus possible to use the highly efficient PPLN 32 and reduce the consumed power.

EXAMPLE 5

Figure 14:
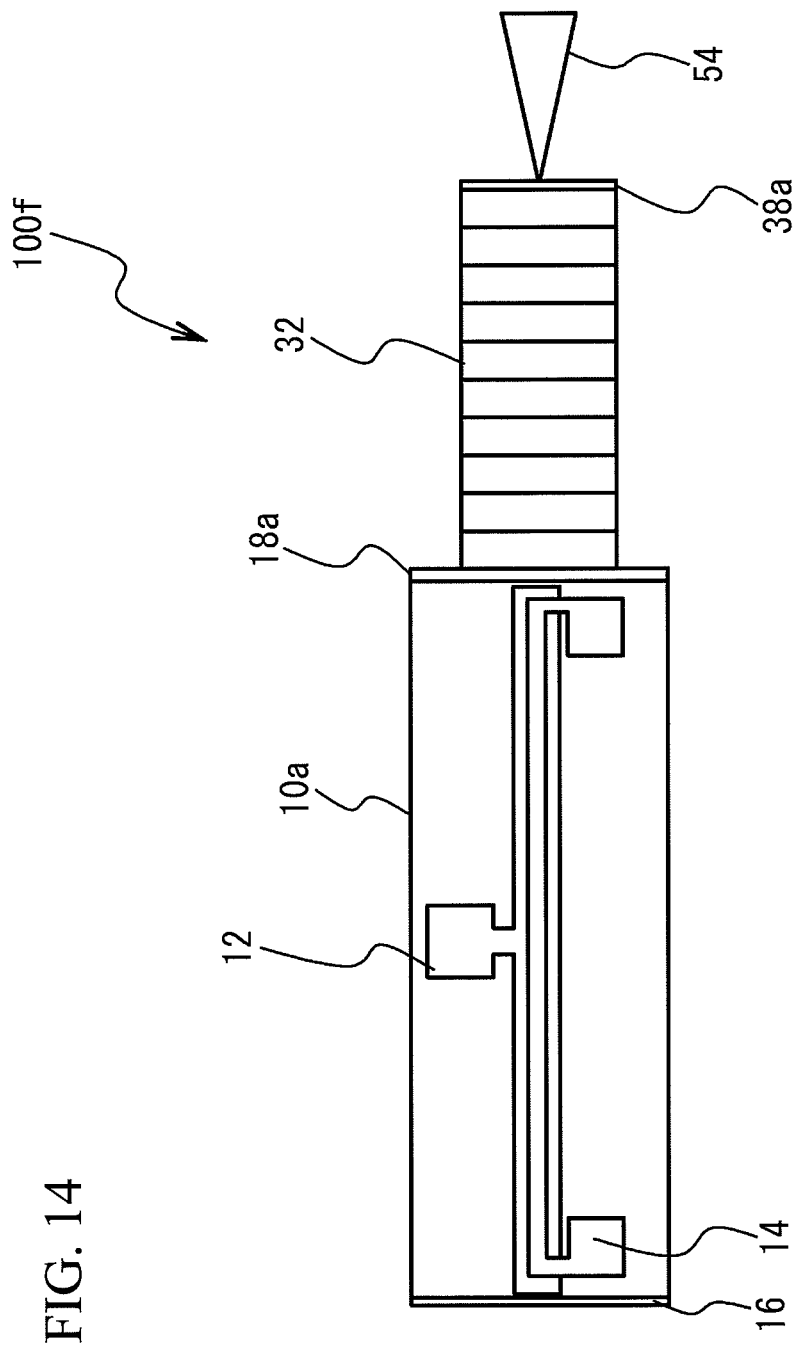
FIG. 14 is a plan view of a laser system in accordance with an example 5.

FIG. 14 is a plan view of a laser system 100f in accordance with an example 5. Referring to FIG. 14, the quantum dot DFB laser 10*a* and the PPLN 30 are connected directly. The end surface of the DFB laser 10*a* on the PPLN 30 side is coated with an optical film 18*a*, which is an AR film for a wavelength of 1064 nm and is an ER film for a wavelength of 532 nm. The end surface of the PPLN 30 from which light is emitted is coated with an optical film 38*a*, which is an ER film for a wavelength of 1064 nm and an AR film for a wavelength of 532 nm. Thus, light of 532 nm generated by the PPLN 32 is not incident to the DFB laser 10*a*. Thus, since light of 1064 nm is reflected by the optical film 38*a* as well as the HR film 16, the oscillation efficiency of the DFB laser 10*a* may be improved. Further, the number of parts may be reduced because of the direction connection between the DFB laser 10*a* and the PPLN 32.

According to the examples 1 through 5, it is possible to the less-expensive, highly efficient laser systems capable of emitting visible light, which is not easily emitted by the semiconductor laser, and realizing high-speed modulation. Particularly, according to the examples 1 through 5, it is possible to obtain green light used for applications such as the laser projection.

Although preferred embodiments of the invention have been described in detail, the present invention is not limited to the particular embodiments but various changes and variations may be made within the scope of the claimed invention.

The invention claimed is:

1. A laser system comprising:
   a DFB laser emitting a laser light having a constant wavelength by a DC current applied to the DFB laser;
   a semiconductor optical amplifier that modulates an intensity of the laser light by a change of a gain of the semiconductor optical amplifier without changing the wavelength of the laser light; and
   a harmonic generation element that converts the laser light modulated to a visible light that is a harmonic of the laser light,
   wherein the constant wavelength is within a range of an effective efficiency of higher than or equal to 80% of the harmonic generation element.

2. The laser system according to claim 1, wherein the DFB laser is a quantum dot DFB laser.

3. The laser system according to claim 1, wherein the DFB laser and the semiconductor optical amplifier are formed on an identical chip.

4. The laser system according to claim 1, wherein the visible light is green light.

5. The laser system according to claim 1, wherein the harmonic generation element converts the laser light modulated to a second harmonic of the laser light.

6. The laser system according to claim 1, further comprising a temperature control part that controls a temperature of the DFB laser so as to be kept constant.

7. The laser system according to claim 1, wherein the visible light is green light used for a laser projection.

8. The laser system according to claim 1, wherein a control part applies the DC current between a first electrode and a second electrode of the DFB laser.

9. The laser system according to claim 1, wherein the DFB laser emits the laser light without an intensity modulation.

10. The laser system according to claim 1, further comprising a control part that controls the current that flows through a heater and keeps the temperature of the DFB laser constant at 20° C.

* * * * *